United States Patent [19]

Bronstert et al.

[11] Patent Number: 4,970,134
[45] Date of Patent: Nov. 13, 1990

[54] MIXTURE CROSSLINKABLE BY PHOTOPOLYMERIZATION

[75] Inventors: Bernd Bronstert, Otterstadt; Manfred Zuerger, Sinsheim, both of Fed. Rep. of Germany

[73] Assignee: BASF Aktiengesellschaft, Ludwigshafen, Fed. Rep. of Germany

[21] Appl. No.: 205,380

[22] Filed: Jun. 10, 1988

[30] Foreign Application Priority Data

Jun. 13, 1987 [DE] Fed. Rep. of Germany ....... 3719844

[51] Int. Cl.$^5$ .................. G03C 1/73; G03C 1/795; G03C 1/93
[52] U.S. Cl. .................. 430/271; 430/281; 430/906; 430/909; 430/954; 430/287; 430/285; 522/19; 522/79; 522/121
[58] Field of Search ............... 430/281, 906, 909, 954, 430/271 A, 271, 287, 285; 522/19, 79, 121

[56] References Cited

U.S. PATENT DOCUMENTS 3,905,819  9/1975  Sakurai et al. .................. 430/909
4,072,529  2/1978  Hoornstra et al. ............. 430/288 X

OTHER PUBLICATIONS

*Chemical Abstracts*, vol. 85, No. 2, 1977, Columbus, Ohio, USA, Baumann, Nicklaus, "Stable Polymer Images by Photopolymerization in a Matrix", Abstract No. 12371q, and Database Index Terms.

*Primary Examiner*—Cynthia Hamilton
*Attorney, Agent, or Firm*—Keil & Weinkauf

[57] ABSTRACT

Multilayer, photosensitive recording materials which can be developed with aqueous media contain one or more layers of a mixture which is crosslinkable by photopolymerization, soluble or dispersible in aqueous media and based on polymer containing hydroxyl and-/or amide groups, as binders, compatible photopolymerizable monomers and photopolymerization initiators, which mixture contains from 0.1 to 10% by weight, based on its total amount, of an aldehyde of the general formula I

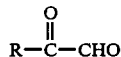

where R is hydrogen, hydroxyl, $C_1$–$C_6$-alkyl, $C_1$–$C_6$-alkoxy, $C_6$–$C_{10}$-aryl or $C_6$–$C_{10}$-aryloxy.

4 Claims, No Drawings

MIXTURE CROSSLINKABLE BY PHOTOPOLYMERIZATION

The present invention relates to a novel mixture which is crosslinkable by photopolymerization, soluble or dispersible in aqueous media and based on polymers containing hydroxyl and/or amide groups, as binders, compatible photopolymerizable monomers and photopolymerization initiators.

The present invention furthermore relates to a novel, multilayer, photosensitive recording material which can be developed with water and contains one or more layers of the novel mixture.

For partially or virtually completely hydrolyzed homo- and copolymers of alkanecarboxylates of vinyl alcohol and for graft copolymers based on these, the term "polyvinyl alcohol" has become established and is used below for the sake of brevity. The alkenecarboxylates, alkenecarbonylamino-N-methylene ethers and carbamates of these polyvinyl alcohols are referred to below as polyvinyl alcohol derivatives for short. The term partially hydrolyzed indicates that from 40 to 98 mol % of the alkanecarboxylate groups originally present in the polymers have been hydrolyzed to hydroxyl groups. Accordingly, the term virtually completely hydrolyzed means a degree of hydrolysis of more than 98 mol %.

Components of mixtures are regarded as compatible if they are capable of remaining dispersed in one another without marked cloudiness.

Mixtures which are crosslinkable by photopolymerization and based on polyvinyl alcohols as binders, compatible photopolymerizable monomers and photopolymerization initiators are disclosed in, for example, DE-A-23 62 005 and are used mainly for the preparation of relief-forming layers of multilayer, photosensitive recording materials, the said layers being crosslinkable by photopolymerization.

However, the known mixtures have disadvantages. For example, adhesion-promoting layers which are crosslinked by photopolymerization and based on these known mixtures are severely damaged during development of the imagewise exposed recording materials with water, causing image elements to become detached as early as the development stage and especially during subsequent printing. Furthermore, after their imagewise exposure and development with water, relief-forming layers of these known mixtures often exhibit damage in the form of small holes, which is generally referred to as pitting. There is also damage due to swelling, and the ink acceptance of the printing areas is frequently inadequate. If such adhesion-promoting layers and relief-forming layers are used together in a recording material, the disadvantageous effects reinforce one another.

Attempts have been made to overcome these disadvantages by the subsequent treatment of the surface of the exposed and developed recording materials of the type under discussion with an aldehyde, such as glyoxal or glyoxylic acid (cf. DE-A-23 62 005). Although this measure makes the exposed and developed recording materials somewhat more resistant to water afterward, it does not solve the other problems, such as the insufficient adhesion of the adhesion-promoting layers or the pitting in the relief-forming layers, which occur as early as the development stage.

It is an object of the present invention to provide, instead of the known mixtures which are crosslinkable by photopolymerization, soluble or dispersible in aqueous media and based on polymers containing hydroxyl and/or amide groups, as binders, compatible, photopolymerizable monomers and photopolymerization initiators, novel mixtures of this type which have improved performance characteristics and are suitable for the preparation of novel, multilayer, photosensitive recording materials which can be developed with aqueous media and do not have the disadvantages of the recording materials known from the prior art.

It is a further object of the present invention to provide novel, improved, photosensitive recording materials of the type under discussion which can be developed with aqueous media and do not exhibit pitting or insufficient adhesion.

We have found that the first object is achieved by a mixture which is crosslinkable by photopolymerization, soluble or dispersible in aqueous media and based on polymers containing hydroxyl and/or amide groups, as binders, compatible, photopolymerizable monomers and photopolymerization initiators, which mixture contains from 0.10 to 10% by weight, based on its total amount, of an aldehyde of the general formula I

where R is hydrogen, hydroxyl, $C_1$–$C_6$-alkyl, $C_1$–$C_6$-alkoxy, $C_6$–$C_{10}$-aryl or $C_6$–$C_{10}$-aryloxy.

We have found that the further object is achieved by a multilayer, photosensitive recording material which can be developed with aqueous media and contains one or more layers of the novel mixture.

Above and below, the total amount of the novel mixture means the sum of the amounts of the polymeric binder, of the photopolymerizable monomers, of the photopolymerization initiator and of the aldehyde of the formula I.

Examples of aldehydes of the general formula I which are to be used according to the invention are glyoxal, glyoxylic acid, aliphatic α-ketoaldehydes, such as 2-oxopropanal, 2-oxobutanal or 2-oxohexanal, aliphatic glyoxylates, such as methyl, ethyl, pentyl or hexyl glyoxylate, araliphatic α-ketoaldehydes, such as 3-phenyl-2-oxopropanal or 3-(4'-methylphenyl)-2-oxopropanal, and aromatic glyoxylates, such as phenyl glyoxylate. Of these aldehydes, glyoxal, glyoxylic acid and methyl glyoxylate are preferred, glyoxal being particularly advantageous.

The novel mixtures contain from 0.1 to 10, preferably from 0.3 to 6, in particular from 0.5 to 4, % by weight, based on the total amount of the mixture, of these aldehydes.

In principle, all polymers are suitable for the preparation of the novel mixtures, provided that these polymers have hydroxyl and/or amide groups and are soluble or dispersible in aqueous media.

Aqueous media are water itself and both solutions of gases and of organic or inorganic solids in water, as well as mixtures of water or of such aqueous solutions with other, predominantly organic solvents.

Examples of suitable aqueous media are water, aqueous ammonia, sodium hydroxide solution, potassium hydroxide solution, aqueous triethylamine, solutions of surfactants, such as alkylsulfonates in water, ethanol/- water, isopropanol/water, n-butanol/water or acetone/water mixtures or mixtures of such alcohols and ketones with aqueous ammonia or sodium hydroxide solution. Water is particularly advantageous.

Suitable polymers which contain hydroxyl and/or amide groups and are soluble or dispersible in aqueous media are the known soluble or dispersible polyamides, polyurethanes, polyvinyl alcohols, polyvinyl alcohol derivatives and polyesters.

However, polyvinyl alcohols and polyvinyl alcohol derivatives are particularly advantageous.

The polyvinyl alcohols which are soluble or dispersible in water are particularly advantageous here, these polyvinyl alcohols containing repeating 1,2-(1-hydroxyethylidene) units

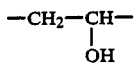

the polymer chain and having number average molecular weights $\overline{M}_n$ of from $10^4$ to $10^5$, in particular from $1.5 \times 10^4$ to $5 \times 10^4$, for example partially or virtually completely hydrolyzed polyvinyl acetate or propionate having a degree of hydrolysis of from 60 to 100%, preferably from 70 to 99%, in particular from 75 to 95%.

The partially or virtually completely hydrolyzed vinyl alkanecarboxylate/alkylene oxide graft copolymers are also particularly advantageous, especially those which are obtained by grafting vinyl acetate or propionate onto polyethylene oxide and then hydrolyzing the product, and consist of from 10 to 30% by weight of 1,3-(1-oxapropylidene) units

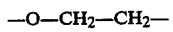

from 0 to 30% by weight of 1,2-(1-acetylethylidene) units

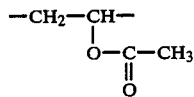

and from 90 to 40% by weight of 1,2-(1-hydroxyethylidene) units, the percentages in each case being based on the graft copolymer.

The polyvinyl alcohol derivatives contain from 0.1 to 10, preferably from 0.5 to 8, in particular from 1 to 6, mol %, based on the hydroxyl groups originally present in the polyvinyl alcohols, of the alkenecarboxylate side radicals introduced by conventional polymeranalogous reactions, such as acrylate, methacrylate or maleate radicals; or of the alkenecarbonylamino-N-methylene ether radicals, such as acryl- or methacrylamido-N-methylene ether radicals; or of the carbamate radicals.

Advantageously, the novel mixtures contain from 30 to 89.89, preferably from 35 to 79.6, in particular from 40 to 74, % by weight, based on the total weight of the mixture, of these binders.

Monomers which are suitable for the preparation of the mixtures are those which are photopolymerizable and are compatible with the binders. Useful monomers of this type generally have a boiling point above 100° C. They usually have a molecular weight of less than 3000, preferably less than 2000.

Examples of suitable monomers are the esters of acrylic acid and/or methacrylic acid with monohydric or polyhydric alcohols, e.g. butyl acrylate, butyl methacrylate, 2-ethylhexyl acrylate, lauryl (meth)acrylate, ethylene glycol di(meth)acrylate, butane-1,4-diol di(meth)acrylate, neopentylglycol di(meth)acrylate, 3-methylpentanediol di(meth)acrylate, 2-hydroxypropyl (meth)acrylate, 2-hydroxyethyl (meth)acrylate, hexane-1,6-diol di(meth)acrylate, 1,1,1-trimethylolpropane tri(meth)acrylate, di-, tri- and tetraethylene glycol di(meth)acrylate, tripropylene glycol di(meth)acrylate, pentaerythritol tetra(meth)acrylate and 3,12-dihydroxy-1,5,10,14-tetraoxatetradec-1,14-diyl di(meth)acrylate. Other suitable compounds are the vinyl esters of aliphatic monocarboxylic acids, such as vinyl oleate; divinyl ethers of alcohols, such as octadecyl vinyl ether and butane-1,4-diol divinyl ether; the diesters of fumaric and maleic acid; and the reaction products of oligobutadienes having terminal OH groups with maleic acid and/or methacrylic acid. Alkenecarbonylamino-N-methylene ethers, such as ethylene glycolbis-, propanediolbis-, butanediolbis-, diethyleneglycolbis-, glycerolbis- or -tris- or pentaerythritoltetrakis-(methacrylamido-N-methylene) ether or the corresponding acrylamido-N-methylene ethers are also suitable. Among these monomers, 3,12-dihydroxy-1,5,10,14-tetraoxatetradec-1,14-diyl di(meth)acrylate and ethyleneglycolbis-, glycerolbis- and glyceroltris(methacrylamido-N-methylene) ether are particularly advantageous.

The novel mixtures contain from 10 to 50, preferably from 20 to 45, in particular from 25 to 40, % by weight, based on the total amount of the mixture, of the monomers.

The mixtures according to the invention contain conventional photopolymerization initiators in an amount of from 0.01 to 10, preferably from 0.1 to 8, in particular from 0.5 to 5, % by weight, based on the total amount of the mixture.

Examples of suitable photoinitiators are benzoin and benzoin derivatives, such as its methyl, isopropyl, n-butyl or isobutyl ether; symmetrically or asymmetrically substituted benzil acetals, such as benzil dimethyl acetal or benzil 1-methyl 1-ethyl acetal; acyldiarylphosphine oxides and acylarylphosphinic acid derivatives, such as 2,6-dimethoxybenzoyldiphenylphosphine oxide, 2,4,6-trimethylbenzoyldiphenylphosphine oxide, sodium 2,4,6-trimethylbenzoylphenylphosphinate or ethyl 2,4,6-trimethylbenzoylphenylphosphinate; and substituted and unsubstituted quinones, such as ethyl anthraquinone, benzanthraquinone, benzophenone or 4,4'-bis-(dimethylamino)benzophenone. They can be used alone or as a mixture with one another.

In addition, the novel mixtures may contain further additives, such as thermal polymerization inhibitors, plasticizers, antiozonants, dyes, pigments, photochromic additives, reducing agents, agents for improving the relief structure, antioxidants, fillers, reinforcing fillers, fluxes, mold release agents, crosslinking assistants, tackifying resins and rubbers. These additives can be added alone or as a mixture with one another, in amounts of up to 100% by weight, based on the total amount of the novel mixture.

The preparation of the novel mixtures from the individual components does not involve any special methods, and the conventional kneading, mixing or dissolution techniques can be used for mixing the components.

The novel mixtures thus obtained can be advantageously used in the production of multilayer photosensitive recording materials which can be developed with aqueous media. For this purpose, they are shaped into layers of the desired thickness in a conventional manner by casting from a solution, hot-pressing, calendering or extrusion. The thickness of the layers depends primarily on whether they are to be used as relief-forming layers or as adhesion-promoting layers. The thickness of the relief-forming layers in turn depends on the intended use of the photo-sensitive recording materials and varies in general from 0.001 to 0.8 mm, whereas the adhesion-promoting layers are usually from 0.0005 to 0.1 mm thick.

The novel multilayer, photosensitive recording materials which can be developed with aqueous media contain either a relief-forming layer or an adhesion-promoting layer of a novel mixture. However, very particularly advantageous recording materials are those whose relief-forming layer and adhesion-promoting layer consist of the novel mixtures.

The relief-forming layer of the recording materials is usually firmly adhesively bonded to a dimensionally stable base. Furthermore, a top layer and/or a cover sheet may be applied to that side of the relief-forming layer which faces away from the base.

If a top layer and a cover sheet are used together, the top layer is present directly on top of the relief-forming layer, and an antiadhesion layer may furthermore be present between the top layer and the cover sheet. Furthermore, a firm adhesive bond can be produced between the relief-forming layer and the cover sheet with the aid of an adhesion-promoting layer.

The dimensionally stable bases usually employed are sheets, foils or sleeves of metals, in particular steel, aluminum, copper or nickel, or of high polymers, e.g. polyethylene terephthalate, polybutylene terephthalate, polyamide or polycarbonate. Woven fabrics and mats, such as glass fiber fabrics, or composite materials of, for example, glass fibers and high polymers, e.g. polyethylene terephthalate, are also suitable as bases.

Suitable adhesion-promoting layers are conventional adhesion-promoting layers which are generally from 0.0005 to 0.1 mm thick. However, adhesion-promoting layers of the novel mixtures are advantageous. These adhesion-promoting layers are either crosslinked by photo-polymerization by uniform exposure or thermally by heat treatment before application of the relief-forming layer, or by photopolymerization after application of the relief-forming layer. Crosslinking before application of the relief-forming layer is preferred.

Conventional top layers are from 0.5 to 20 μm thick and may consist of a polymer which forms soluble, nontacky, transparent and strong films, for example polyamide, amide copolymers, polyurethane, polyvinyl alcohol, polyvinyl pyrrolidone, polyethylene oxide having a molecular weight greater than 105 or cyclized rubber having a high degree of cyclization. If necessary, the top layer may be matt.

Conventional cover sheets are from 20 to 150 μm thick and consist of a polymer such as polyamide or polyethylene terephthalate.

Conventional antiadhesion layers are from 0.1 to 0.5 μm thick and consist of, for example, silicone resins.

If highly reflective sheets or foils are used as the base, they may contain conventional antihalation agents, such as carbon black or manganese dioxide or non-migrating dyes or pigments. The antihalation agents can, however, also be present as a separate layer on the base or be contained in the adhesion-promoting layer or in the relief-forming layer.

The production of the multilayer, photosensitive recording materials which can be developed with aqueous media does not involve any special methods. The production is usually carried out by applying a relief-forming layer to the base, which has been provided with an adhesion-promoting layer, by casting from solution, hot pressing, calendering or extrusion. The other layers can then be applied to such a recording material in a known manner. However, it is also possible first to apply the relief-forming layer to that side of a cover sheet which is covered with a top layer and then firmly to bond the uncovered side of the relief-forming layer to the base.

Crosslinked printing plates and photoresists can be produced from the said recording materials in a conventional manner by photopolymerization. The production does not involve any special methods but is carried out, if necessary after a pretreatment, by imagewise exposure of the recording materials to actinic light having a wavelength λ of from 300 to 450 nm, advantageously from 320 to 400 nm, through a photographic negative placed on top, washing out the unexposed and therefore uncrosslinked parts of the printing plates and photoresists with an aqueous medium and drying the printing plates and photo-resists obtained in this manner, which are crosslinked by photopolymerization and now contain a relief layer.

Conventional pretreatments are, for example, the removal of any cover sheet present in the photosensitive recording material or uniform exposure of the relief-forming layer and/or of the adhesion-promoting layer to actinic light from the back, i.e. from that side which faces away from the printing surface.

Examples of suitable sources of actinic light are commercial UV fluorescence tubes, medium pressure, high pressure and low pressure mercury lamps, superactinic fluorescent tubes, pulsed xenon lamps, metal iodide-doped lamps and carbon arc lamps.

A conventional aftertreatment is uniform post-exposure of the printing plates and photoresists cross-linked by photopolymerization.

The thickness of the relief layer of the exposed and developed multilayer recording materials varies from 0.001 to 0.8 mm, depending on the intended use.

The printing plates obtained in a conventional manner, crosslinked by photopolymerization and based on the novel mixtures can be mounted on printing cylinders in the usual manner and used for continuous printing.

With regard to their preparation, processing and use, the novel mixtures have particular unexpected advantages which make them superior to the prior art. For example, their preparation does not involve any special measures, and the preparation methods usually employed for such mixtures may be used. Because of their high heat stability, they can very readily be processed by conventional methods to give a very wide variety of products without special safety measures having to be taken. They have an excellent shelf life and can be disposed of in an environmentally compatible manner, which is a great advantage in industry. In view of the prior art, the shelf life is particularly surprising since in fact the mixtures were expected to undergo premature crosslinking.

The multilayer, photosensitive recording materials which can be developed with aqueous media and are based on the novel mixtures also exhibit particular unexpected technical effects.

For example, their relief-forming layers of the novel mixtures reproduce even the finest image elements of originals in excellent quality. Particularly noteworthy is the quality of the relief layers produced from this relief-forming layer by exposure and development. These relief layers are very hard and have very little sensitivity to water and excellent ink acceptance. In particular, these relief layers show no damage through swelling and no pitting, and an additional aftertreatment with aldehydes is no longer necessary. During printing with these relief layers, very high print runs are achieved without relief parts becoming detached. Moreover, even relief-forming layers consisting of the novel mixtures which are more than 0.8 mm thick still have very good exposure properties, so that recording materials which contain these thick layers are suitable for the production of hot stamping dies.

Adhesion-promoting layers based on the novel mixtures have the advantage that they can be crosslinked not only by photopolymerization but also by the action of heat. This makes it possible for the performance characteristics of the adhesion-promoting layers to be better tailored both to the base and to the relief-forming layer, with the result that the adhesion of the adhesion-promoting layers can readily be optimized in an advantageous manner. The thermally crosslinked and/or photo-crosslinked adhesion-promoting layers are therefore capable of solving problems relating to the adhesion of relief-forming layers of a wide variety of compositions to bases consisting of a very wide range of materials. The cross-linked adhesion-promoting layers are extremely resistant to swelling and insensitive to water. Printing plates which contain these adhesion-promoting layers are particularly dimensionally stable, resistant to inks and abrasion-resistant; even after very long print runs, relief parts do not become detached.

Very particular advantages are obtained if relief-forming layers and adhesion-promoting layers based on the novel mixtures are used together. This results in recording materials in which the abovementioned particular technical effects reinforce one another. The sensitivity of the known recording materials to overwashing, which is extremely troublesome in practice and no longer occurs in the novel materials, should be mentioned in particular in this context.

EXAMPLES

Example 1

Production of a multilayer, photosensitive recording material which can be developed with aqueous media and contains a relief-forming layer of a novel mixture; production method:

A 10 $\mu$m primer layer of a conventional polyurethane was first applied to a 240 $\mu$m thick steel sheet. A 20% strength solution of a partially hydrolyzed polyvinyl acetate (degree of hydrolysis 80 mol %, number average molecular weight $\overline{M}_n$ 2.5 × 10$^4$) in a methanol/water mixture (volume ratio 1:1) was cast on the primer layer in such a way that, after drying at 150° C. for 3 minutes, a 10 $\mu$m thick top layer resulted.

For the preparation of the relief-forming layer, a 30% strength solution of
30 parts by weight of a polyvinyl alcohol derivative containing methacrylate radicals (degree of hydrolysis 80 mol %, number average molecular weight $\overline{M}_n$ 2.5×10$^4$, content of methacrylate radicals 5 mol %),
39 parts by weight of a polyvinyl alcohol (degree of hydrolysis 80 mol %, number average molecular weight $\overline{M}_n$ 2.5 ×10$^4$),
26 parts by weight of 3,12-dihydroxy-1,5,10,14-tetraoxatetradec-1,14-diyl diacrylate, 2 parts by weight of benzil dimethyl acetal, 0.5 part by weight of cyclohexyldiazeniumdioxy potassium salt,
0.02 part by weight of Safranine 0 (C.I. 50240) and 2 parts by weight of glyoxal
in water/n-propanol (volume ratio 1:1) was prepared. This solution could be stored for a fairly long time at room temperature without gel formation or separation taking place.

The solution was cast on the top layer of the steel sheet in such a way that, after drying at an air temperature of 90° C. for 10 minutes, a 35 $\mu$m thick relief-forming layer resulted.

The printing plate produced in this manner and crosslinkable by photopolymerization was first exposed for 60 seconds through a halftone negative and then exposed for a further 60 seconds through a crossline screen negative (tonal value 30%, 32 lines/cm). The light source used was a commercial printing plate exposure unit which was equipped with superactinic fluorescent tubes. The imagewise exposed printing plate was developed in the same way as an offset printing plate by rubbing with water with the aid of a deep-etch pad at room temperature for 40 seconds. The developed printing plate was dried in a through-circulation drier for 10 minutes at 80° C.

The printing plate thus produced showed no damage through swelling as a result of the development step. In a tampon printing press, the plate could be used to produce 40,000 prints of satisfactory quality without the relief breaking off or showing other signs of wear.

Comparative Experiment A

Production of a multilayer, photosensitive recording material which can be developed with aqueous media and contains a relief-forming layer of a known mixture; production method:

The procedure was essentially the same as that described in Example 1, except that the relief-forming layer did not contain any glyoxal. After the imagewise exposure and development, the plate showed damage in the form of small holes (pitting) and distorted and detached screen walls in the solid areas and in the fine screen walls. This plate was unsuitable for printing on a tampon printing press.

Example 2

Production of a multilayer, photosensitive recording material which can be developed with aqueous media and contains a relief-forming layer of a novel mixture; production method:

The procedure was essentially the same as that described in Example 1, except that the relief-forming layer was 150 $\mu$m thick instead of 35 $\mu$m. 30 minutes were required to dry this layer. For imagewise exposure, a film negative having halftone images was used, so that instead of a plate having wells, as required for gravure or tampon printing, a plate having a printing relief, as required for normal or indirect letterpress printing (letterset printing), was obtained. The imagewise exposed printing plate was developed with water at 30° C. for 60 seconds in a commmercial brush washer. An excellent plate having well formed 50 $\mu$m wide lines, 3% screen tonal value and 32 lines/cm was obtained. Neither the dots nor the lines exhibited, at the edges, delamination or other damage due to swelling, which usually occurs during or after the washout process as a result of the action of water.

Comparative Experiment B

Production of a multilayer, photosensitive recording material which can be developed with aqueous media and contains a relief-forming layer of a known mixture; production method:

The procedure was essentially the same as that described in Example 2, except that the relief-forming layer did not contain any glyoxal. Although the imagewise exposed printing plate could be washed out within 40 seconds, the resulting plate was useless because the lines and dots showed damage due to swelling and parts of the relief had become detached from the base.

Example 3

Production of a multilayer, photosensitive recording material which can be developed with aqueous media and contains a relief-forming layer of a novel mixture; production method:

The procedure was essentially the same as that described in Example 1, except that the base used was an electrochemically grained and anodized offset base consisting of aluminum. Furthermore, in order to obtain the desired thickness of 3 μm for the dry relief-forming layer, the solids content of the casting solution was reduced to 10% and the wet application weight was decreased. After exposure according to Example 2 and washout in tap water, an offset plate was obtained which accepted the oily printing ink only in the exposed parts of the layer when rubbed with an ink/water emulsion of the oil-in-water type and gave prints of excellent quality in a long print run on an offset printing machine.

Comparative Experiment C

Production of a multilayer, photosensitive recording material which can be developed with aqueous media and contains a relief-forming layer of a known photosensitive mixture; production method:

The procedure was essentially the same as that described in Example 3, except that the relief-forming layer did not contain any glyoxal. When the exposed, developed and dried offset plate was rubbed with a conventional ink/water emulsion of the oil-in-water type, the plate accepted the printing ink in the exposed image areas only inadequately, so that this plate could not be used for printing.

Example 4

Production of an adhesion-promoting layer of the novel mixture; production method:

A 35% strength solution of
30 parts by weight of a polyvinyl alcohol derivative having side methacrylate radicals (degree of hydrolysis 80 mol %, number average molecular weight $\overline{M}_n$ 2.5×10⁴, content of methacrylate radicals 5 mol %),
30 parts by weight of a polyvinyl alcohol (degree of hydrolysis 80 mol %, number average molecular weight $\overline{M}_n$ 2.5 ×10⁴),
30 parts by weight of ethylene glycolbis-(acrylamido-N-methylene) ether,
8 parts by weight of N-n-butylbenzenesulfonamide,
2 parts by weight of benzil dimethyl acetal and
2 parts by weight of glyoxal
in water/n-propanol (volume ratio 3:1) was applied with a knife coater to a 300 μm thick polyethylene terephthalate film which was coated with a 10 μm thick primer layer of a conventional polyurethane, in such a way that, after drying at 90° C. for 20 minutes, a 50 μm thick adhesion-promoting layer resulted.

The adhesion-promoting layer was exposed uniformly to actinic light for 5 minutes.

When the adhesion-promoting layer crosslinked by photopolymerization was subjected to a wash test at 40° C. in a spray washer under a nozzle pressure of 4 bar, it was destroyed only after a washing time of 20 minutes.

Comparative Experiment D

Production of an adhesion-promoting layer of a known photosensitive mixture; production method:

The procedure was essentially the same as that described in Example 4, except that the adhesion-promoting layer did not contain any glyoxal. The adhesion-promoting layer crosslinked uniformly by photopolymerization was completely destroyed after only 5 minutes in the wash test.

Example 5

Production of a multilayer, photosensitive recording material which can be developed with aqueous media and contains an adhesion-promoting layer of a novel mixture; production method:

A 30% strength solution of
30 parts by weight of a polyvinyl alcohol derivative having side methacrylate radicals (degree of hydrolysis 80 mol %, number average molecular weight $\overline{M}_n$ 2.5×10⁴, content of methacrylate radicals 5 mol %),
40 parts by weight of a polyvinyl alcohol (degree of hydrolysis 80 mol %, number average molecular weight $\overline{M}_n$ 2.5×10⁴),
26 parts by weight of ethylene glycolbis-(acrylamido-N-methylene) ether,
2 parts by weight of benzil dimethyl acetal and
2 parts by weight of glyoxal
in water/n-propanol (volume ratio 3:1) was applied with a knife coater to a 240 μm thick steel sheet which was coated with a 10 μm thick primer layer of a conventional polyurethane, in such a way that, after drying at 80° C. for 10 minutes, a 10–12 μm thick adhesion-promoting layer resulted.

The adhesion-promoting layer was exposed uniformly for 15 seconds in a tube exposure unit which was equipped with commercial superactinic fluorescent tubes.

For the production of the relief-forming layer, a 60% strength aqueous solution of a mixture of 30 parts by weight of a polyvinyl alcohol (degree of hydrolysis 80 mol %, number average molecular weight $\overline{M}_n$ 2.5 ×10⁴),
30 parts by weight of a polyvinyl alcohol derivative having side methacrylate radicals (degree of hydrolysis 80 mol %, number average molecular weight $\overline{M}_n$ 2.5×10₄, content of methacrylate radicals 6 mol %),
35 parts by weight of glycerolbis-(acrylamido-N-methylene) ether,
5 parts by weight of N-n-butylbenzenesulfonamide,
2 parts by weight of benzoin isopropyl ether and
0.5 part by weight of cyclohexyldiazeniumdioxy potassium salt
in water was cast on the adhesion-promoting layer cross-linked uniformly by photopolymerization, in such a way that, after drying, a relief-forming layer 200 μm thick and having a residual water content of about 6% by weight resulted.

The printing plate produced in this manner was exposed through a film negative for 60 seconds in a printing plate exposure unit which had an iron-doped medium pressure mercury lamp as the light source. The imagewise exposed printing plate was then developed for 70 seconds in a spray washer under a spray pressure of 40 mPas.

The plate thus obtained, having a relief height of 200 μm, was very suitable for printing. Excellent prints were obtained, in which even the finest image details were retained. Even 100% overwashing during development was withstood by the plate without loss of quality; absolutely no delamination of relief parts was observed.

Comparative Experiment E

Production of a multilayer, photosensitive recording material which can be developed with aqueous media and contains an adhesion-promoting layer of a known photosensitive-mixture; production method:

The procedure was essentially the same as that described in Example 5, except that the adhesion-promoting layer did not contain any glyoxal. The resulting printing plate was likewise exposed imagewise for 60 seconds and then washed out with water.

In contrast to the plate produced according to Example 5, in the comparison plate the fine 50 μm thick lines (5% screen tonal values and 32 lines/cm) were no longer satisfactorily bonded to the base. When a washout time of 140 seconds was employed, corresponding to 100% overwashing, a very serious lack of adhesion was observed even for the 100 μm wide isolated lines and even at 10% screen tonal values. In general, the plate obtained was completely unsuitable for printing.

Example 6

Production of a multilayer, photosensitive recording material which can be developed with aqueous media and contains a thermally crosslinked adhesion-promoting layer of a novel mixture; production method:

The procedure was essentially the same as that described in Example 5, except that the adhesion-promoting layer was crosslinked not by photopolymerization but thermally at 155°C. for 2 minutes.

Further processing of the printing plate was carried out as described in Example 5.

The plate obtained was very suitable for printing by the indirect letterpress printing method. Even its finest image elements exhibited excellent adhesion. Even a washout time of 140 seconds, corresponding to 100% overwashing, did not lead to any damage to the plate as a result of delamination.

Example 7

Production of a multilayer, photosensitive recording material which can be developed with aqueous media and contains an adhesion-promoting layer and a relief-forming layer of a novel mixture; production method:

The procedure was essentially the same as that described in Example 6, except that the novel mixture from Example 1 was used for the production of the relief-forming layer. The plate obtained showed neither pitting nor deficient adhesion and was of excellent quality. The plate gave excellent printed copies even after very long print runs, and absolutely no delamination of relief parts was observed even after repeated use.

We claim:

1. A photosensitive recording element for the production of relief printing plates, the photosensitive recording element consisting essentially of
   (A) a dimensionally stable base,
   (B) a adhesion-promoting layer which has been prepared by either uniformly exposing to actinic light or thermally treating a layer consisting essentially of
      ($b_1$) at least one polymeric binder selected from the group consisting of partially and virtually completely hydrolyzed polyvinyl alcohol alkenecarboxylates, partially and virtually completely hydrolyzed vinyl alkenecarboxylate/alkylene oxide graft copolymers, partially and virtually completely hydrolyzed polyvinyl alcohol alkenecarboxylates containing side alkenecarboxylate, alkenecarbonylamino-N-methylene ether and/or carbamate radicals, and partially or virtually completely hydrolyzed vinyl alkanecarboxylate/alkylene oxide graft copolymers containing side alkenecarboxylate, alkenecarbonylamino-N-methylene ether and/or carbamate radicals,
      ($b_2$) at least one photopolymerizable monomer compatible with the side polymeric binder ($b_1$),
      ($b_3$) at least one photopolymerization initiator, and
      ($b_4$) from 0.1 to 10% by weight, based on the sum of all the components of the layer, of an aldehyde of the formula I

wherein R is hydrogen, hydroxyl, $C_1$–$C_6$-alkyl, $C_1$–$C_6$-alkoxy, $c_6$–$C_{10}$-aryl or $C_6$–$C_{10}$-aryloxy, and
   (C) a photopolymerizable recording layer developable with neutral aqueous solvents comprising at least one of the said polymeric binders ($b_1$), at least of the said photopolymerizable monomers ($b_2$) compatible with the said polymeric binders ($b_1$), and at least one photopolymerization initiator ($b_3$).

2. The photosensitive recording element of claim 1, where the photopolymerizable recording layer (C) further contains from 0.1 to 10% by weight, based on the complete weight of the photopolymerizable recording layer (C), an aldehyde of the formula I

where R is hydrogen, hydroxyl, $C_1$–$C_6$-alkyl, $C_1$–$C_6$-alkoxy, $C_6$–$C_{10}$-aryl or $C_6$–$C_{10}$-aryloxy.

3. The photosensitive recording element of claim 1, where the aldehyde I is glyoxal, glyoxylic acid or methylglyoxylate.

4. The photosensitive recording element of claim 2, where the aldehyde I is glyoxal, glyoxylic acid or methylglyoxylate.

* * * * *

UNITED STATES PATENT AND TRADEMARK OFFICE
CERTIFICATE OF CORRECTION

PATENT NO. : 4,970,134
DATED : November 13, 1990
INVENTOR(S) : Bernd BRONSTERT et al.

It is certified that error appears in the above-identified patent and that said Letters Patent is hereby corrected as shown below:

IN THE CLAIMS
Column 12,
Claim 1, lines 14 and 15

"alkenecarboxylates" should read --alkanecarboxylates--

Claim 1, line 16

"alkenecarboxylate/alkylene" should read --alkanecarboxylate/alkylene--

Claim 1, line 45 after "least" insert --one--

Signed and Sealed this

Fourteenth Day of September, 1993

Attest:

BRUCE LEHMAN

Attesting Officer    Commissioner of Patents and Trademarks